United States Patent
Mawhinney et al.

(10) Patent No.: US 10,270,193 B1
(45) Date of Patent: Apr. 23, 2019

(54) CONCENTRIC SPRINGS FOR SENSOR CONNECTION

(71) Applicant: Continental Automotive Systems, Inc., Auburn Hills, MI (US)

(72) Inventors: Nicholas Lee Mawhinney, Linden, MI (US); Michael J Zaitz, Royal Oak, MI (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 15/846,128

(22) Filed: Dec. 18, 2017

(51) Int. Cl.
*H01R 12/00* (2006.01)
*H01R 12/71* (2011.01)
*H01R 13/6582* (2011.01)
*H01R 13/24* (2006.01)

(52) U.S. Cl.
CPC ....... *H01R 12/712* (2013.01); *H01R 13/2421* (2013.01); *H01R 13/6582* (2013.01)

(58) Field of Classification Search
CPC .. H01R 23/722; H01R 23/725; H01R 12/585; H05K 7/1084
USPC ......................................... 439/66, 70, 74, 82
See application file for complete search history.

(56) References Cited

U.S. PATENT DOCUMENTS

| | | | | |
|---|---|---|---|---|
| 3,950,846 A * | 4/1976 | Johnson | ............... | H01H 13/702 29/882 |
| 4,961,709 A * | 10/1990 | Noschese | ........... | H01R 13/2421 439/591 |
| 6,442,039 B1 * | 8/2002 | Schreiber | ........... | H01R 13/2435 361/760 |
| 6,517,362 B2 * | 2/2003 | Hirai | ....................... | H01L 24/72 257/E23.078 |
| 6,821,129 B2 * | 11/2004 | Tsuchiya | .............. | G01R 1/0483 361/769 |
| 6,843,658 B2 * | 1/2005 | Kuwabara | .......... | H01R 13/2421 439/66 |
| 6,887,085 B2 * | 5/2005 | Hirai | .................. | G01R 1/06716 439/66 |
| 7,080,993 B2 * | 7/2006 | Yoshida | ............. | G01R 1/07357 257/E23.078 |
| 7,219,426 B2 * | 5/2007 | Haga | .................... | G01R 1/0466 29/874 |
| 7,275,562 B2 * | 10/2007 | Barth | ...................... | G02B 6/125 137/590 |
| 7,322,831 B1 * | 1/2008 | Peng | .................. | H01R 13/2421 439/591 |
| 7,775,808 B2 * | 8/2010 | Okuda | .................. | H01R 12/57 439/245 |

(Continued)

*Primary Examiner* — Thanh Tam T Le

(57) ABSTRACT

A sensor assembly, having an inner spring, a middle spring circumscribing the inner spring, and an outer spring circumscribing the middle spring. Each of the springs are connected to a first circuit board and a second circuit board. An axis extends through the inner spring, the middle spring, and the outer spring such that the springs are rotatable about the axis, and the inner spring, middle spring, and outer spring provide electrical communication between the first circuit board and the second circuit board regardless of the orientation of the inner spring, middle spring, and outer spring about the axis. The first circuit board is a sensor board, and the second circuit board is a printed circuit board (PCB), but it is within the scope of the invention that different types of circuit boards may be used in various combinations.

16 Claims, 10 Drawing Sheets

(56) References Cited

U.S. PATENT DOCUMENTS

| | | | |
|---|---|---|---|
| 7,790,987 B2 * | 9/2010 | Kasahara | H01L 24/16 174/260 |
| 7,931,475 B2 * | 4/2011 | Kim | H01R 12/57 439/66 |
| 9,040,841 B2 * | 5/2015 | Hougham | H01R 12/7082 174/261 |

* cited by examiner

US 10,270,193 B1

CONCENTRIC SPRINGS FOR SENSOR CONNECTION

FIELD OF THE INVENTION

The invention relates generally to a sensor assembly having a conductive coil which includes concentric springs, where the conductive coil provides a connection between two electrically conductive boards and/or sensor elements.

BACKGROUND OF THE INVENTION

Sensors are used for many different types of applications, and are manufactured in many different configurations. Sensors often have multiple components, which are assembled together during manufacturing. Some sensors have multiple circuit boards, which are connected together using various wires. However, some components are more difficult to connect than others, and various electrical components may electrically interfere with one another.

Accordingly, there exists a need for a way to connect multiple circuit boards and/or sensor elements, while allowing for flexibility of assembly of components, and minimizing or eliminating electrical interference between electrical components.

SUMMARY OF THE INVENTION

In one embodiment, the present invention is a sensor assembly, having an inner spring, a middle spring circumscribing the inner spring, and an outer spring circumscribing the middle spring, or in alternate embodiments, any further number of springs. A first circuit board is connected to a first end of the inner spring, a first end of the middle spring, and a first end of the outer spring, and a second circuit board connected to a second end of the inner spring, a second end of the middle spring, and a second end of the outer spring. An axis extends through the inner spring, the middle spring, and the outer spring such that the inner spring, the middle spring, and the outer spring are rotatable about the axis, and the inner spring, middle spring, and outer spring provide electrical communication between the first circuit board and the second circuit board regardless of the orientation of the inner spring, middle spring, and outer spring about the axis.

In one embodiment, the first circuit board is a sensor board, and the second circuit board is a printed circuit board (PCB), but it is within the scope of the invention that different types of circuit boards and/or sensor elements may be used in various combinations.

In one embodiment, the coil assembly includes a first insulation layer surrounded by the inner spring, a second insulation layer surrounding the inner spring and surrounded by the middle spring, a third insulation layer surrounding the middle spring, and surrounded by the outer spring, and a fourth insulation layer surrounding the outer spring. Each insulation layer has the ability to provide electrical isolation, such that the second insulation layer electrically isolates the middle spring from the inner spring, and the third insulation layer electrically isolates the middle spring from the outer spring.

In one embodiment, each of the inner spring, middle spring, and outer spring are approximately the same length, and each of the first insulation layer, second insulation layer, third insulation layer, and fourth insulation later are approximately the same length as the inner spring, middle spring, and outer spring. However, in alternate embodiments, the length of each of the first insulation layer, second insulation layer, third insulation layer, and fourth insulation later is less than the length of the inner spring, middle spring, and outer spring. Although the use of insulation layers has been described above, it is within the scope of the invention in other alternate embodiments that any other type of separating element made of a suitable material may be used to electrically isolate the springs.

In one embodiment, a lower panel is integrally formed with each of the first insulation layer, the second insulation layer, and the third insulation layer. A first aperture is formed as part of the lower panel, a second aperture is formed as part of the lower panel, and a third aperture is formed as part of the lower panel. The coil assembly also has a plurality of knuckle portions, where at least one of the knuckle portions is formed as part of the inner spring, another of the knuckle portions is formed as part of the middle spring, and another of the knuckle portions is formed as part of the outer spring. Each of the knuckle portions extends through one of the apertures such that the knuckle portions are in contact with one of the first circuit board or the second circuit board.

In one embodiment, the outer spring is a ground spring, and the ground spring provides a faraday cage effect between the springs, reducing electromagnetic inference with other nearby electrical components, and between each of the inner spring, middle spring, and outer spring.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
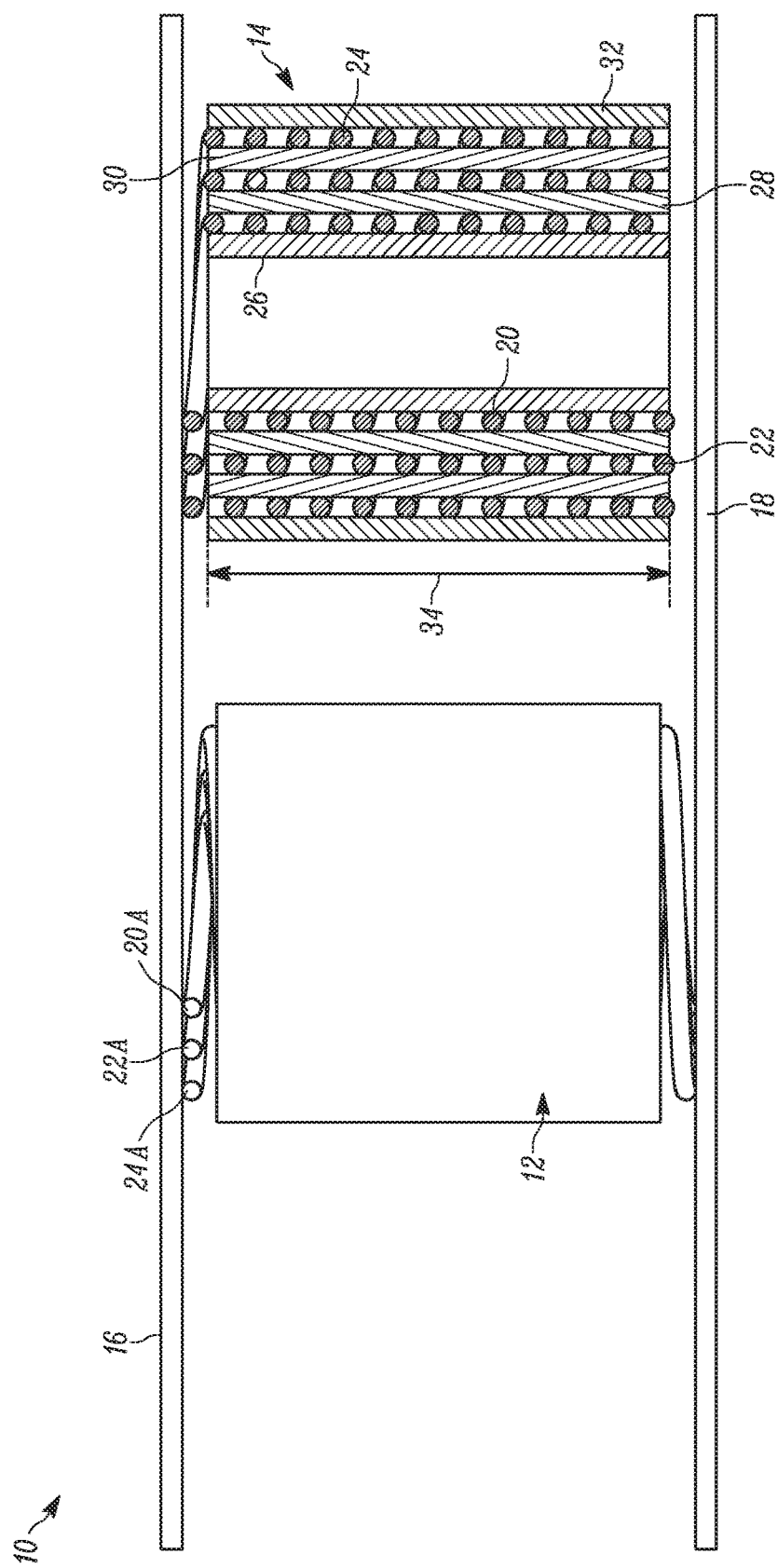
FIG. 1 is a partial sectional view of an assembly having two coil assemblies, according to embodiments of the present invention.
Figure 2A:
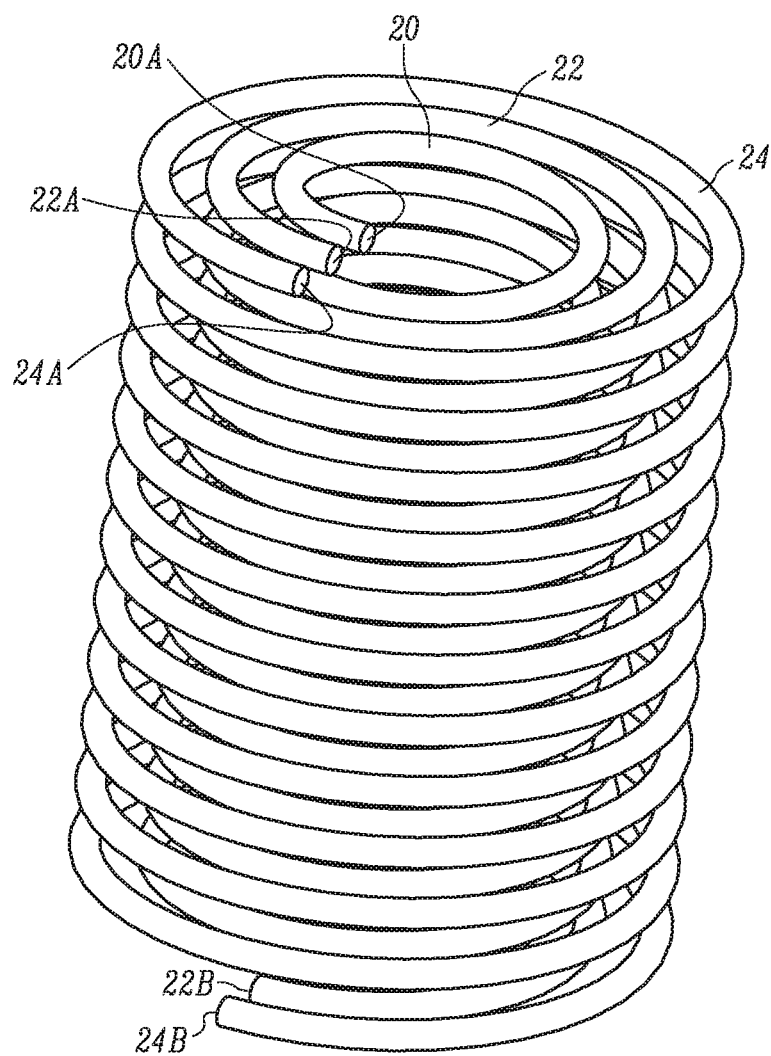
FIG. 2A is a perspective view of a coil assembly with the insulation layers removed, according to embodiments of the present invention.
Figure 2B:
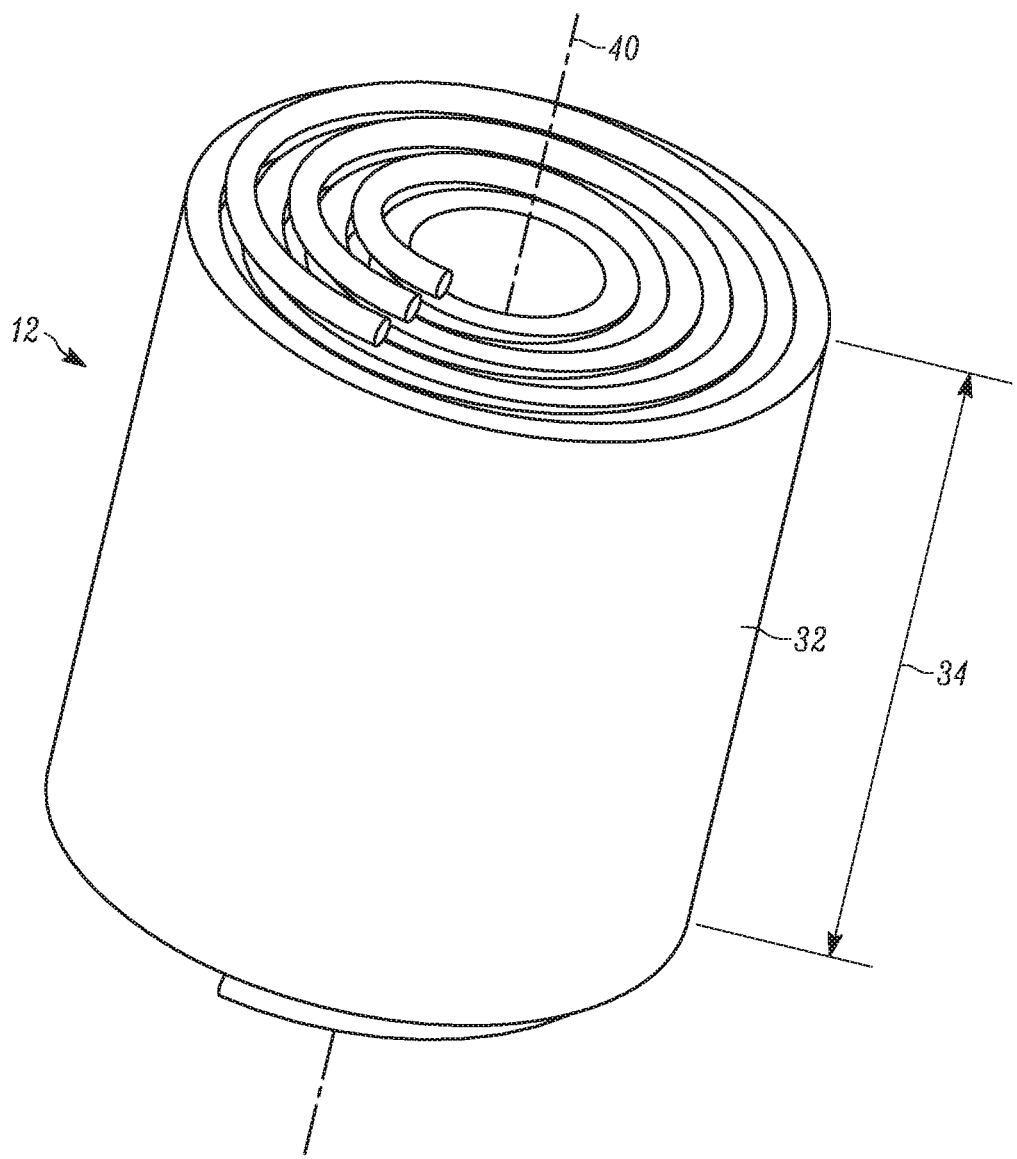
FIG. 2B is a perspective view of a coil assembly, according to embodiments of the present invention.
Figure 3A:
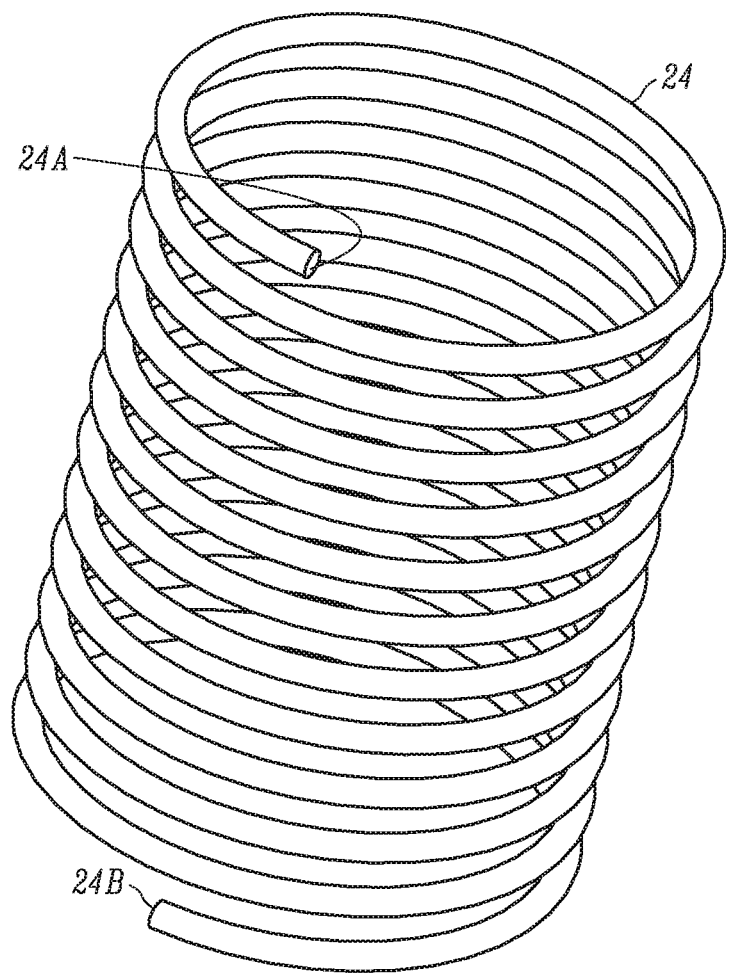
FIG. 3A is a perspective view of an outer spring used as part of a coil assembly, according to embodiments of the present invention.
Figure 3B:
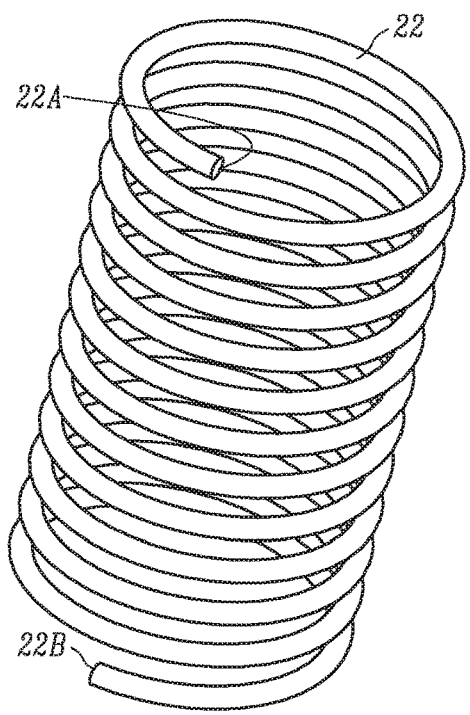
FIG. 3B is a perspective view of a middle spring used as part of a coil assembly, according to embodiments of the present invention.
Figure 3C:
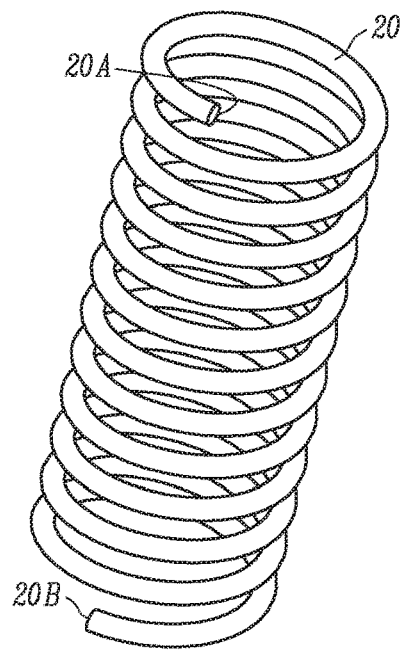
FIG. 3C is a perspective view of an inner spring used as part of a coil assembly, according to embodiments of the present invention.
Figure 4A:
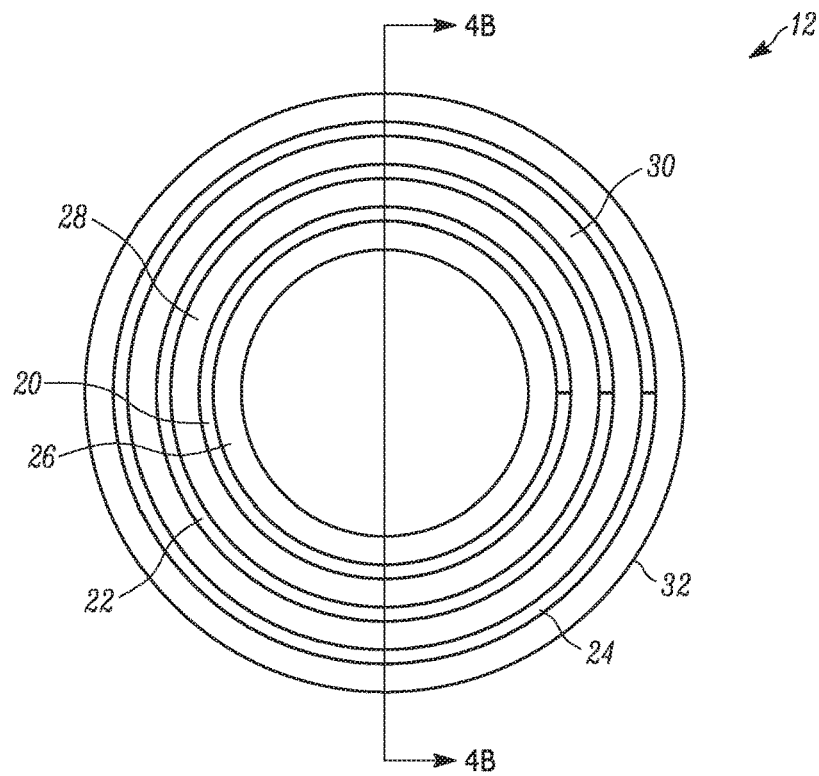
FIG. 4A is a top view of a coil assembly, according to embodiments of the present invention.
Figure 4B:
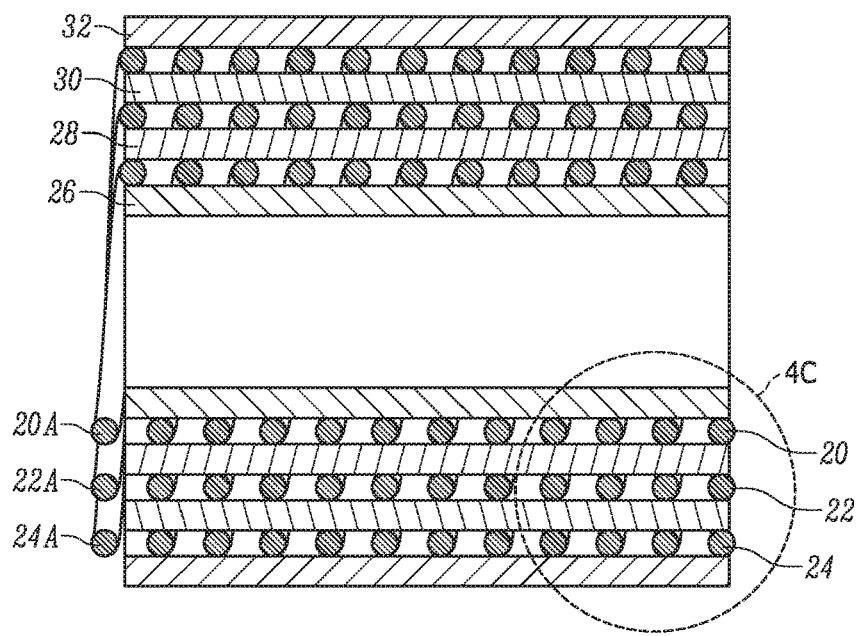
FIG. 4B is a sectional view taken along lines A-A of FIG. 4A.
Figure 4C:
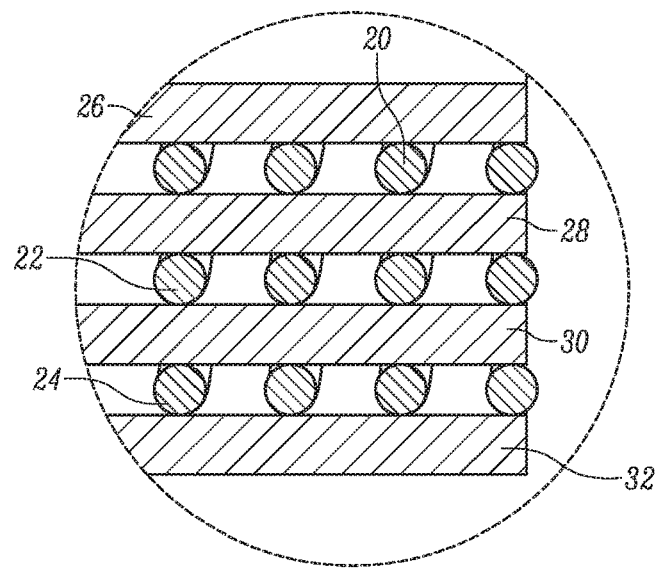
FIG. 4C is an enlarged view of the circled portion of FIG. 4B
Figure 5:
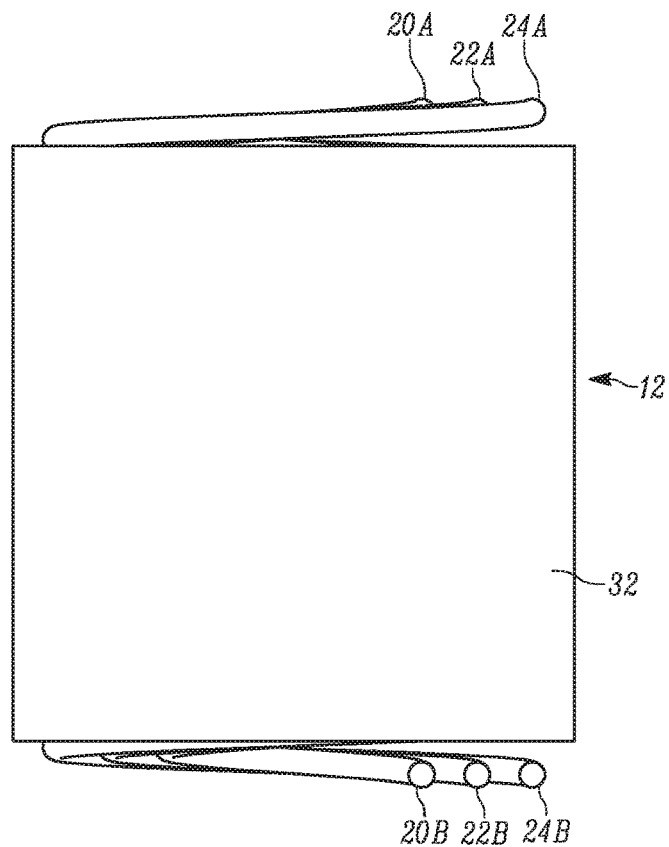
FIG. 5 is a side view of a coil assembly, according to embodiments of the present invention.

An assembly having two conductive coil assemblies is shown in FIG. 1, generally at 10. Both the first conductive coil assembly, shown generally at 12, and the second conductive coil assembly, shown generally at 14, are connected to circuit boards, which in this embodiment is a sensor board 16 and a printed circuit board (PCB) 18.

Each conductive coil assembly 12,14 is of similar construction, and therefore only one conductive coil assembly 12 is to be described. The coil assembly 12 includes a first, or inner spring 20, having a first end 20A and a second end 20B. The coil assembly 12 also has a middle spring 22 having a first end 22A and a second end 22B, and the coil assembly 12 has a third, or outer spring 24, having a first end 24A and a second end 24B.

The springs 20,22,24 are concentrically assembled, such that the middle spring 22 is outside of the inner spring 20, and the outer spring 24 is outside of the middle spring 22. There are also multiple insulation layers which are cylindrically shaped, surrounding and disposed between the springs 20,22,24. More specifically, there is a first insulation layer 26 which is surrounded by the inner spring 20, and a second insulation layer 28 which is disposed between the inner spring 20 and middle spring 22 such that the second insulation layer 28 surrounds the inner spring 20, and is surrounded by the middle spring 22. There is a third insulation layer 30 which is disposed between the middle spring 22 and outer spring 24 such that the third insulation layer 30 surrounds the middle spring 22, and is surrounded by the outer spring 24. A fourth insulation layer 32 surrounds the outer spring 24.

The first end 20A,22A,24A of each spring 20,22,24 is connected to the sensor board 16 and the second end 20B,22B,24B of each spring 20,22,24 is connected to the PCB 18. The inner spring 20 is used for transferring a signal from the sensor board 16 to the PCB 18, the middle spring 22 is used for supplying power from the PCB 18 to the sensor board 16, and the outer spring 24 is used for providing a ground connection between the sensor board 16 and the PCB 18.

Each of the insulation layers 26,28,30,32 electrically isolate the springs 20,22,24 from one another. The insulation layers 26,28,30,32 may be made of a plastic material. However, it is within the scope of the invention that the insulation layers 26,28,30,32 may be made of any suitable material which electrically isolates the springs 20,22,24 from one another. In the embodiment shown in the Figures, the length 34 of the insulation layers 26,28,30,32 is similar to that of the springs 20,22,24, but in alternate embodiments, the length of the insulation layers 26,28,30,32 may be less than that of the springs 20,22,24, as long as the insulation layers 26,28,30,32 electrically isolate the springs 20,22,24 from one another. In an alternate embodiment, one or more of the insulation layers 26,28,30,32 may be integrally formed with a housing. It is also within the scope of the invention in other alternate embodiments that any other type of separating element made of a suitable material may be used to electrically isolate the springs.

Figure 6:
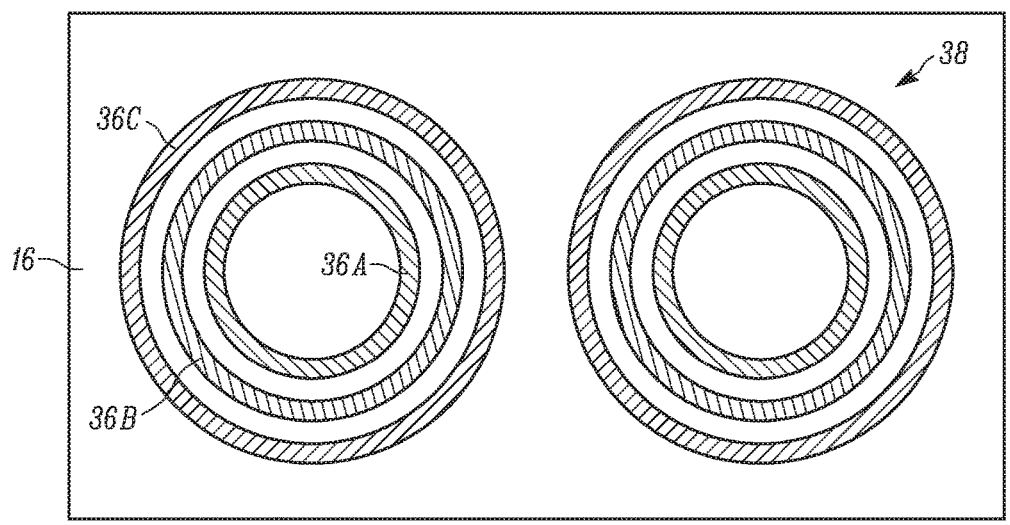
FIG. 6 is a bottom view of a sensor board used as part of a coil assembly, according to embodiments of the present invention.
Figure 7A:
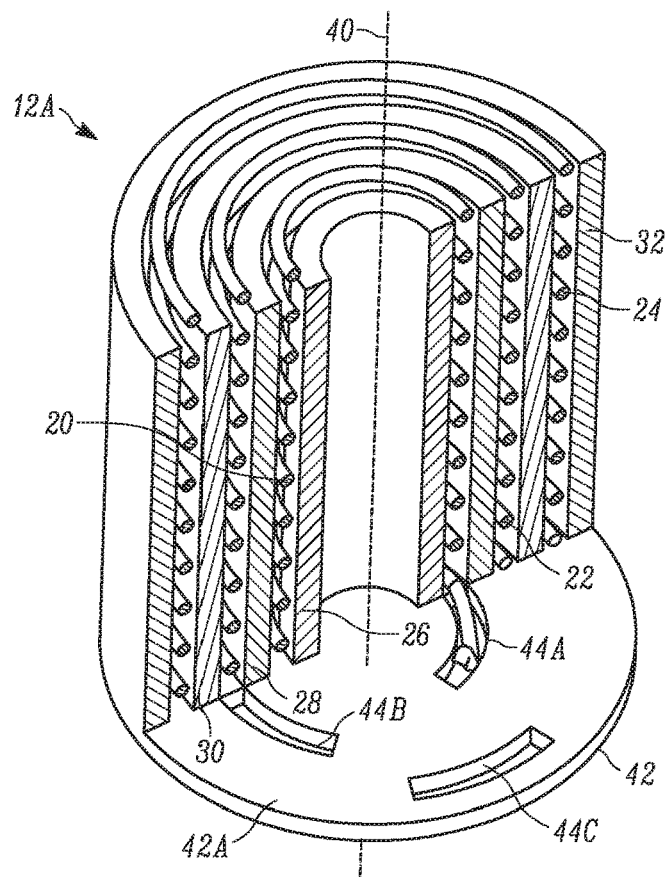
FIG. 7A is a sectional perspective view of an alternate embodiment of a coil assembly, according to embodiments of the present invention.
Figure 7B:
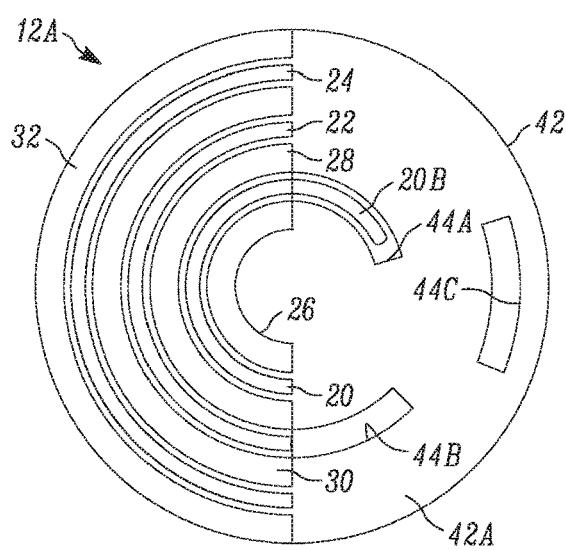
FIG. 7B is a sectional top view of an alternate embodiment of a coil assembly, according to embodiments of the present invention.
Figure 7C:
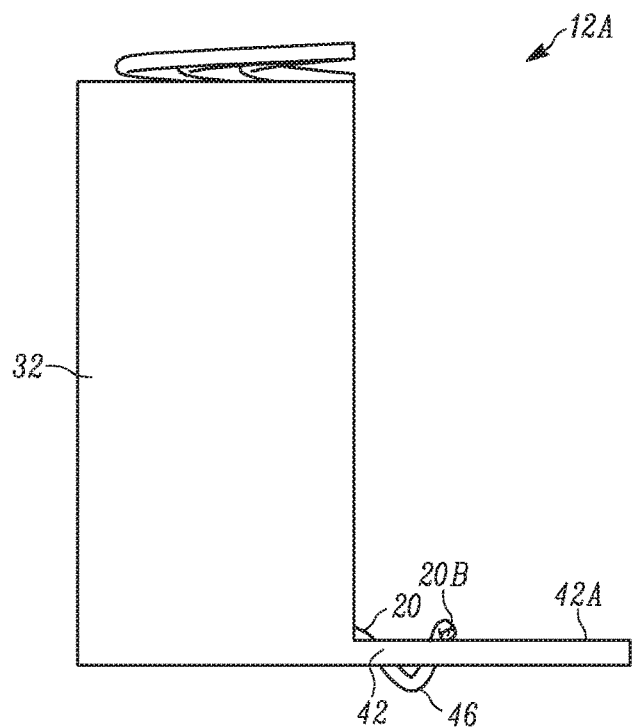
FIG. 7C is a sectional front view of an alternate embodiment of a coil assembly, according to embodiments of the present invention.
Figure 7D:
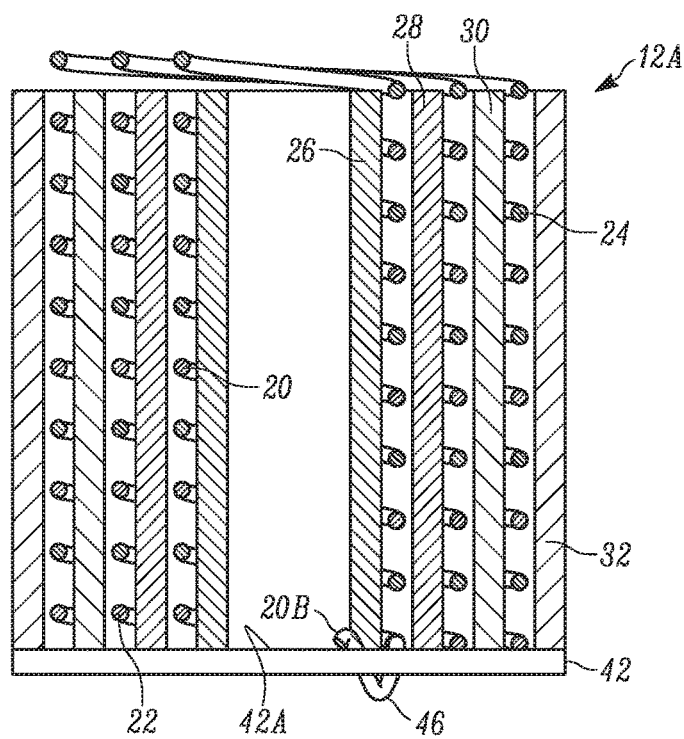
FIG. 7D is a sectional side view of an alternate embodiment of a coil assembly, according to embodiments of the present invention.

The sensor board 16 has concentric circular bond pads for connection with the first ends 20A,22A,24A of the springs 20,22,24, and the PCB 18 also has concentric circular bonds pads for connection with the second ends 20B,22B,24B of the springs 20,22,24. Referring now to FIG. 6, there is a first circular bond pad 36A, which is in contact with the first end 20A of the inner spring 20 of the first coil assembly 12, a second circular bond pad 36B which is in contact with the first end 22A of the middle spring 22 of the first coil assembly 12, and a third circular bond pad 36C which is in contact with first end 24A of the outer spring 24 of the first coil assembly 12. The circular bond pads 36A,36B,36C are part of the sensor board 16. There is also another group of concentric circular bonds pads, shown generally at 38, which are part of the sensor board 16 and are connected to the respective ends 20A,22A,24A of the springs 20,22,24 of the second coil assembly 14.

The PCB 18 also has corresponding concentric circular bonds pads which are in contact with the ends 20B,22B,24B of the springs 20,22,24 for both of the coil assemblies 12,14. The circular bonds pads of the PCB 18 are similar to the circular bond pads 36A,36B,36C,38 of the sensor board 16. The coil assembly 12 is rotatable about an axis 40, such that the first ends 20A,22A,24A of the springs 20,22,24 may be in contact along any area of the corresponding circular bond pads 36A,36B,36C of the sensor board 16, and the second ends 20B,22B,24B may be in contact along any area of the corresponding circular bond pads of the PCB 18. This allows the coil assembly 12 (and in a similar manner, the coil assembly 14) to provide electrical communication between the sensor board 16 and the PCB 18, regardless of how the coil assembly 12 is rotated and positioned about the axis 40.

As mentioned above, the third spring 24 provides a ground connection between the sensor board 16 and the PCB 18. The third spring 24 blocks electromagnetic fields produced by the first spring 20 and the second spring 22, providing a "Faraday Cage Effect," reducing electromagnetic inference with other nearby electrical components.

While in the embodiment described above, three springs 20,22,24 have been used, but it is within the scope of the invention that more or less springs may be used, and arranged concentrically, depending on the application.

An alternate embodiment of the conductive coil assembly is shown in FIGS. 7A-7D generally at 12A, with like numbers referring to like elements. In this embodiment, there is a lower panel 42, and each of the insulating layers 26,28,30,32 are integrally formed with the lower panel 42, such that the lower panel 42 and the insulating layers 26,28,30,32 are made of the same material. The lower panel 42 has a first aperture 44A, a second aperture 44B, and a third aperture 44C. A portion of the inner spring 20 extends into the first aperture 44A as shown in FIGS. 7A-7D, such that a knuckle portion 46 extends through the aperture 44A, and the second end 20B is in contact with an inner surface 42A of the lower panel 42. Also not shown is a knuckle portion of the middle spring 22 extends through the second aperture 44B, and a knuckle portion of the outer spring 24 extends through the third aperture 44C.

During assembly, the springs 20,22,24 are positioned between each of the insulating layers 26,28,30,32 as shown in FIGS. 7A-7D. A cap portion, not shown, having a similar shape to the lower panel 42, is then attached to the insulating layers 26,28,30,32. The cap portion may be attached using any suitable connection, such as a snap-fit connection, a weld, or the like. The cap portion includes corresponding apertures, similar to the apertures 44A,44B,44C, and a knuckle formed in proximity to the first end 20A,22A,24A of each spring 20,22,24 extends through each of the corresponding apertures.

Once the conductive coil assembly 12A is assembled, the conductive coil assembly 12A may be assembled with the sensor board 16 and the PCB 18 such that the knuckle portion 46 near the second end 20B of the inner spring 20 is in contact with an area of one of the circular bond pads of the PCB 18, and the knuckle portion (not shown) near the first end 20A of the inner spring 20 is in contact with the circular bond pad 36A of the sensor board 16. Similarly, the knuckle portion near each of the first ends 22A,24A of the springs 22,24 are in contact with the corresponding circular bond pads 36B,36C of the sensor board 16, and the knuckle portion near the second ends 22B,24B of the springs 22,24 is in contact with the corresponding circular bond pads of the PCB 18.

In a similar manner to the coil assembly 12 in the previous embodiment, the coil assembly 12A is rotatable about the axis 40, such that the knuckle portion located in proximity to the first ends 20A,22A,24A of the springs 20,22,24 may be in contact along any area of the corresponding circular bond pads 36A,36B,36C of the sensor board 16, and the knuckle portion located in proximity to the second ends 20B,22B,24B may be in contact along any area of the corresponding circular bond pads of the PCB 18. The coil assembly 12A therefore provides electrical communication between the sensor board 16 and the PCB 18, regardless of how the coil assembly 12A is rotated and positioned about the axis 40.

In the embodiment shown in FIGS. 7A-7D, the springs 20,22,24 of the coil assembly 12A are not connected to the bond pads 36A,36B,36C,38 of the sensor board 16 or the bond pads of the PCB 18 as described with the previous embodiment. In the embodiment shown in FIGS. 7A-7D, once the coil assembly 12A is properly oriented relative to the sensor board 16 and the PCB 18, the lower panel 42 may be connected to the PCB 18 in any known suitable manner, such as, but not limited to, connectors having a press-fit, interference fit, a latch, or any other suitable connector. The cap portion may be connected to the sensor board 16 in a similar manner.

In an another alternate embodiment of the coil assembly 12A shown in FIGS. 7A-7D, only portions of the circular bond pads 36A,36B,36C,38 may be needed if it is known how the coil assemblies 12,14,12A may be oriented relative to the sensor board 16 and the PCB 18, which reduces the amount of material needed to create the circular bond pads 36A,36B,36C,38.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An apparatus, comprising:
    a coil assembly, including:
        a plurality of springs arranged concentrically relative to one another; and
        at least one insulation layer circumscribing at least one of the plurality of springs such that the at least one insulation layer electrical isolates at least two of the plurality of springs from one another;
    a plurality of circuit boards, the coil assembly connected to at least two of the plurality of circuit boards; and
    an axis extending through the coil assembly, the coil assembly rotatable about the axis;
    wherein the plurality of springs are configured in any position about the axis, and still provide electrical communication between the at least two of the plurality of circuit boards.

2. The apparatus of claim 1, one of the plurality of circuit boards further comprising a sensor board.

3. The apparatus of claim 1, wherein each of the plurality of springs is approximately the same length, and the at least one insulation layer is approximately the same length as each of the plurality of springs.

4. The apparatus of claim 1, wherein the length of the at least one insulation layer is less than the length of each of the plurality of springs.

5. The apparatus of claim 1, further comprising a plurality of insulation layers, one of the plurality of insulation layers circumscribing the outermost of the plurality of springs.

6. The apparatus of claim 1, further comprising:
    a lower panel integrally formed with the at least one insulation layer;
    at least one aperture, the at least one aperture being part of the lower panel;
    at least one knuckle portion formed as part of one of the plurality of springs;
    wherein the at least one knuckle portion extends through the at least one aperture such that the at least one knuckle portion is in contact with one of the plurality of circuit boards.

7. The apparatus of claim 1, one of the plurality of springs further comprising a ground spring.

8. The apparatus of claim 7, wherein the ground spring provides a faraday cage effect.

9. An sensor assembly, comprising:
    an inner spring;
    a middle spring circumscribing the inner spring;
    an outer spring circumscribing the middle spring;
    a first insulation layer surrounded by the inner spring;
    a second insulation layer surrounding the inner spring and surrounded by the middle spring;
    a third insulation layer surrounding the middle spring, and surrounded by the outer spring; and
    a fourth insulation layer surrounding the outer spring;
    wherein the second insulation layer electrical isolates the middle spring from the inner spring, and the third insulation layer electrically isolates the middle spring from the outer spring;
    a first circuit board connected to a first end of the inner spring, a first end of the middle spring, and a first end of the outer spring;
    a second circuit board connected to a second end of the inner spring, a second end of the middle spring, and a second end of the outer spring;
    an axis extending through the inner spring, the middle spring, and the outer spring such that the inner spring, the middle spring, and the outer spring are rotatable about the axis;
    wherein the inner spring, middle spring, and outer spring provide electrical communication between the first circuit board and the second circuit board independently of how the inner spring, middle spring, and out spring are positioned about the axis.

10. The sensor assembly of claim 9, the first circuit board further comprising a sensor board.

11. The sensor assembly of claim 9, wherein each of the inner spring, middle spring, and outer spring are approximately the same length.

12. The sensor assembly of claim 11, wherein each the first insulation layer, second insulation layer, third insulation layer, and fourth insulation later are approximately the same length as the inner spring, middle spring, and outer spring.

13. The sensor assembly of claim 9, wherein the length of each of the first insulation layer, second insulation layer, third insulation layer, and fourth insulation later is less than the length of the inner spring, middle spring, and outer spring.

14. The sensor assembly of claim 9, further comprising:
a lower panel integrally formed with each of the first insulation layer, the second insulation layer, and the third insulation layer;
a first aperture being part of the lower panel;
a second aperture being part of the lower panel;
a third aperture being part of the lower panel; and
a plurality of knuckle portions, at least one of the plurality of knuckle portions formed as part of the inner spring, another of the plurality of knuckle portions formed as part of the middle spring, and another of the plurality of knuckle portions formed as part of the outer spring;
wherein the knuckle portion formed as part of the inner spring extends through the first aperture and is in contact with one of the first circuit board or the second circuit board, the knuckle portion formed as part of the middle spring extends through the second aperture and is in contact with one of the first circuit board or the second circuit board, and the knuckle portion formed as part of the outer spring extends through the third aperture and is in contact with one of the first circuit board or the second circuit board.

15. The sensor assembly of claim 9, the outer spring further comprising a ground spring.

16. The sensor assembly of claim 15, wherein the ground spring provides a faraday cage effect.

* * * * *